United States Patent [19]

Schaefer et al.

[11] Patent Number: 5,402,356

[45] Date of Patent: Mar. 28, 1995

[54] BUFFER CIRCUIT DESIGN USING BACK TRACK SEARCHING OF SITE TREES

[75] Inventors: Thomas J. Schaefer, Cupertino; Robert D. Shur, Los Altos, both of Calif.

[73] Assignee: VLSI Technology, Inc., San Jose, Calif.

[21] Appl. No.: 862,895

[22] Filed: Apr. 2, 1992

[51] Int. Cl.$^6$ ............................................. G06F 15/60
[52] U.S. Cl. ..................................... 364/489; 364/488
[58] Field of Search ..................... 364/490, 489, 488; 307/443, 447

[56] References Cited

U.S. PATENT DOCUMENTS

| | | | |
|---|---|---|---|
| 4,555,642 | 11/1985 | Morales | 307/475 |
| 4,698,760 | 10/1987 | Lembach et al. | 364/490 |
| 4,890,016 | 12/1989 | Tanaka et al. | 307/443 |
| 5,109,168 | 4/1992 | Rusu | 364/490 |
| 5,187,784 | 2/1993 | Rowson | 395/500 |

OTHER PUBLICATIONS

C. L. Berman, et al. "The Fanout Problem: From Theory to Practice". Advanced Research In VLSI, Proceedings of the Decennial CalTech Conf. on VLSI Mar. 1989, ed. Charles L. Seitz, 69–99.

K. J. Singh, et al. "A Heuristic Algorithm for the Fanout Problem". 27th ACM/IEEE Design Automation Conf., 1990, 357–360.

H. J. Touati, et al., "Performance–Oriented Technology Mapping" Advanced Research In VLSI, Proceedings of the Sixth MIT Conf., 1990, ed. W. J. Dally, 79–97.

*Primary Examiner*—Vincent N. Trans
*Attorney, Agent, or Firm*—Burns, Doane, Swecker & Mathis

[57] ABSTRACT

A buffer circuit for fanning out a source signal to a plurality of terminals of specified polarities in accordance with specified time constraints is designed by an automated method in which a circuit template is specified in terms of a tree structure. The terminals are ordered in increasing order of required arrival times of the source signal at each of the terminals. A first terminal in a resulting order is assigned to a highest-level potential terminal site of a same polarity as said first terminal, and buffers on a signal path between said first terminal and the source signal are sized so as to satisfy, if possible, a required arrival time of the source signal at said first terminal. So long as required times of arrival are met, additional terminals are placed in like manner. The method proceeds as far as possible using a straight forward assignment procedure of terminals to potential terminal sites, then backtracks, undoing so much of the previous assignments as necessary and making incremental adjustments to allow the method to proceed further if possible. The method is completed when either all terminals have been successfully assigned or all of the previous assignments have been undone.

15 Claims, 7 Drawing Sheets

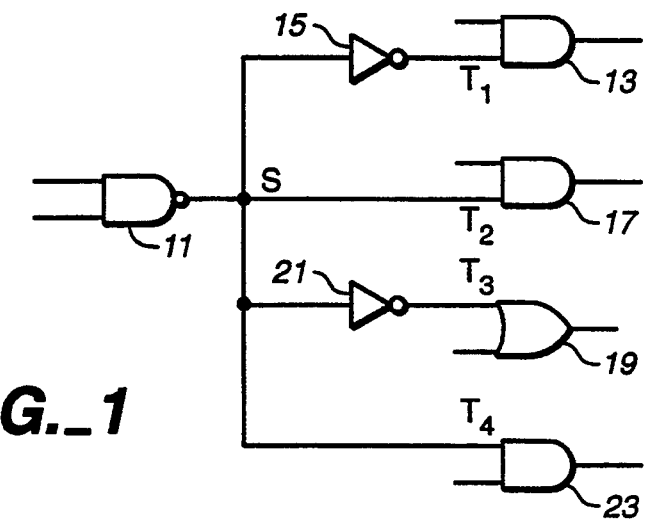
FIG._1
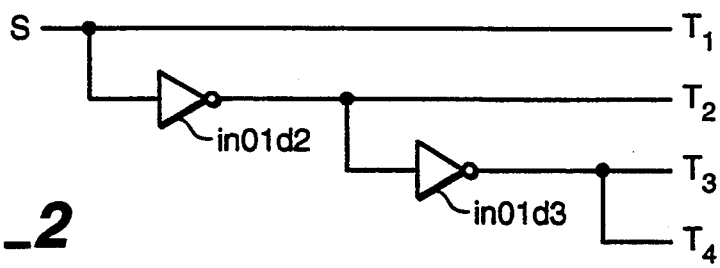
FIG._2
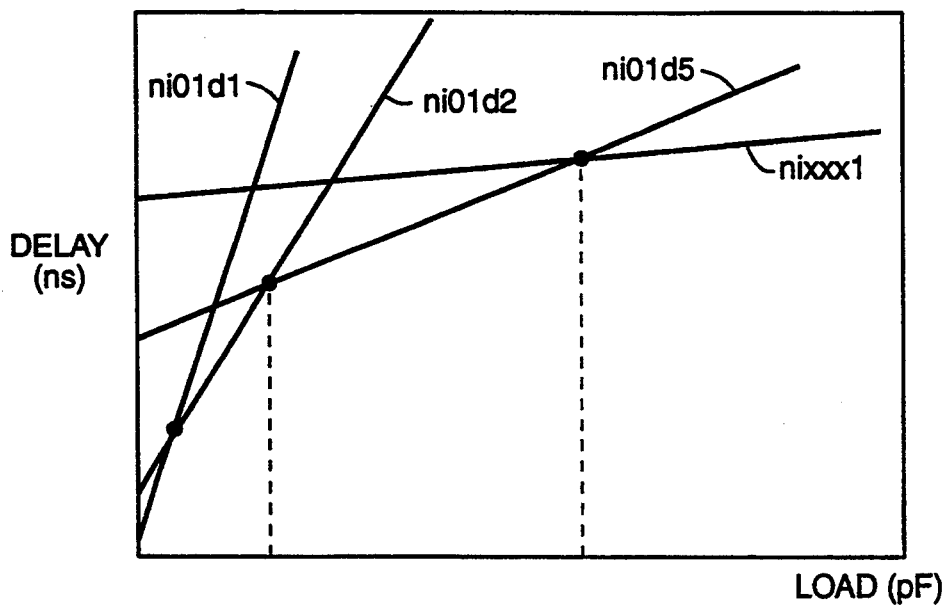
FIG._6

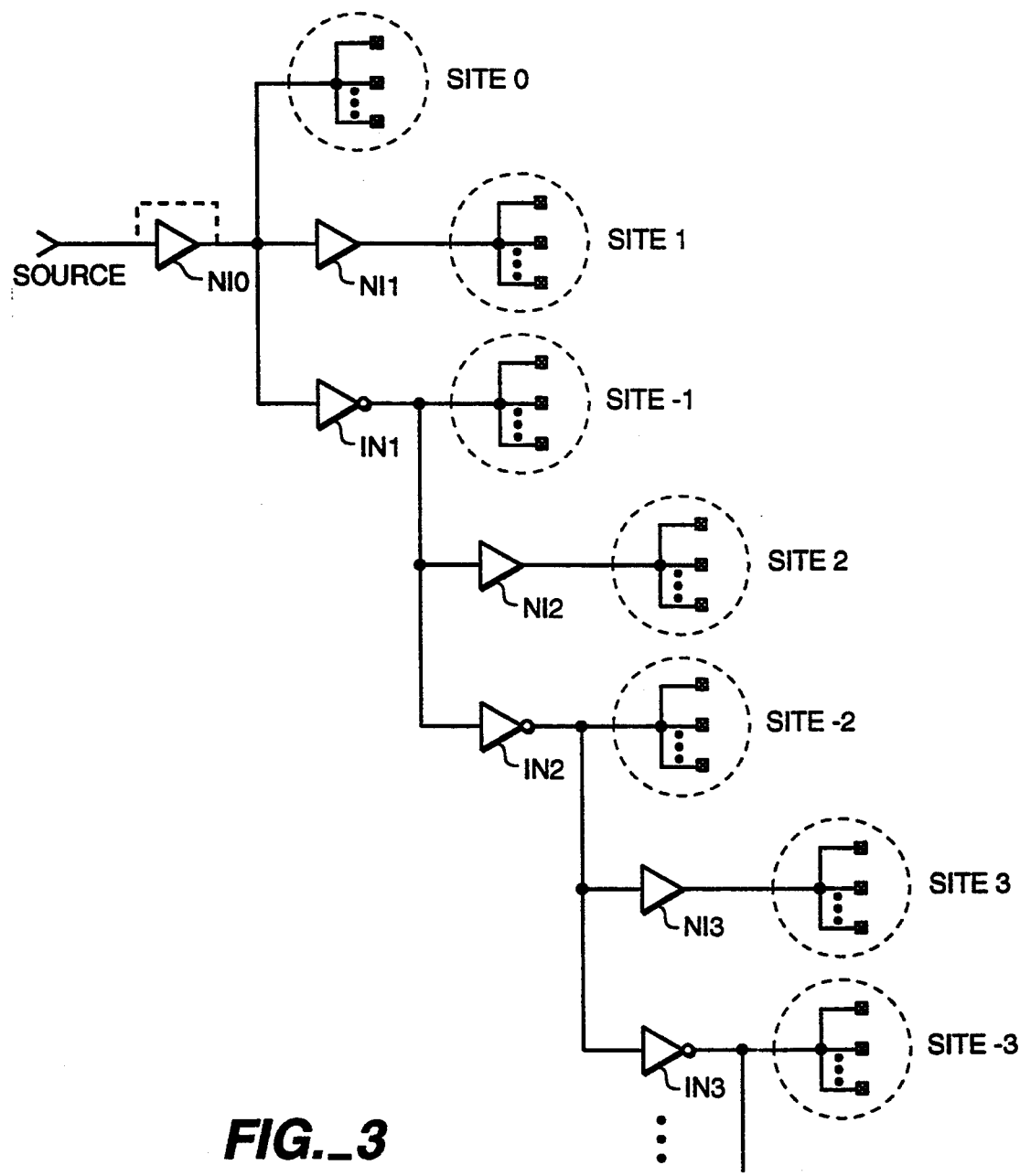
FIG._3

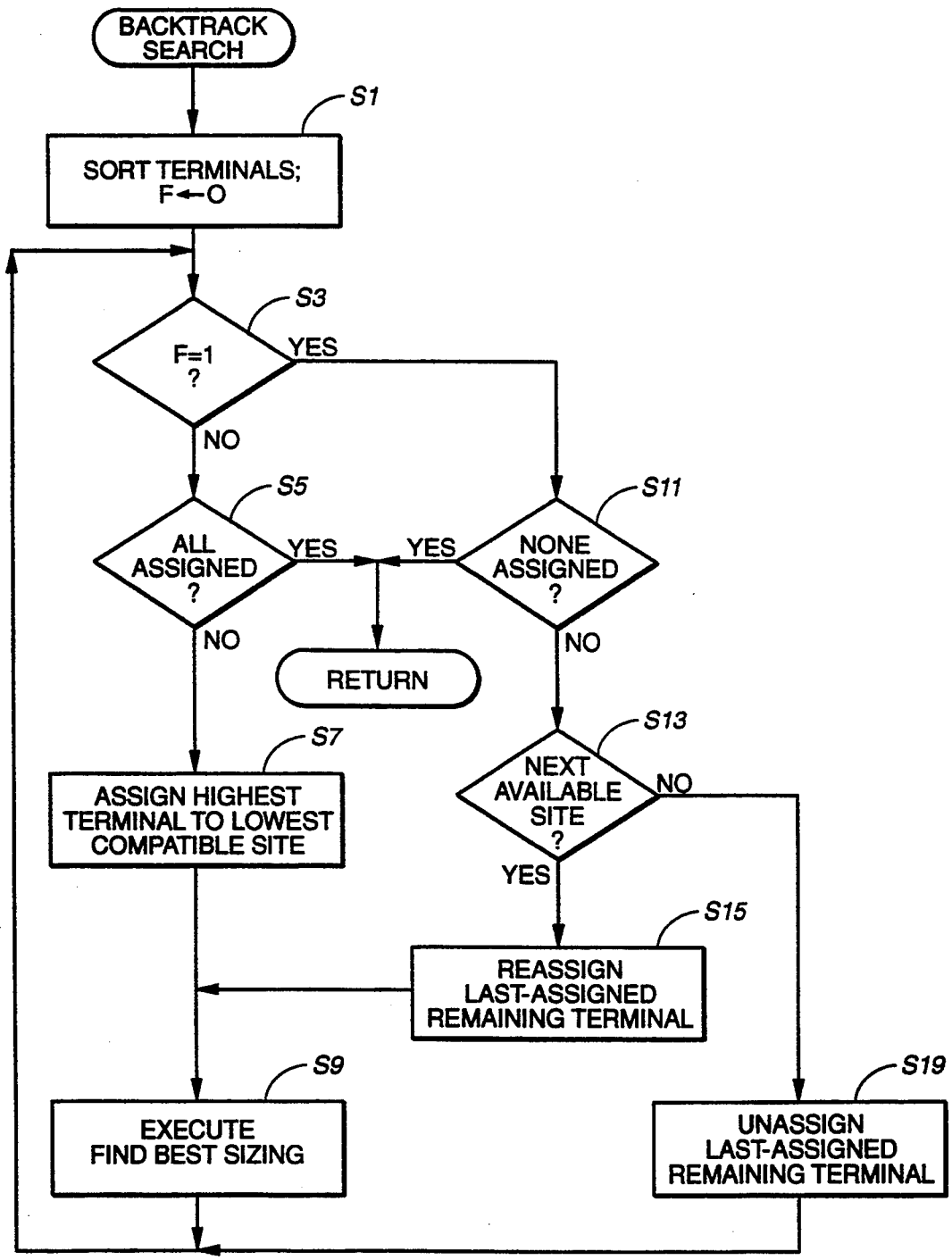
FIG._4

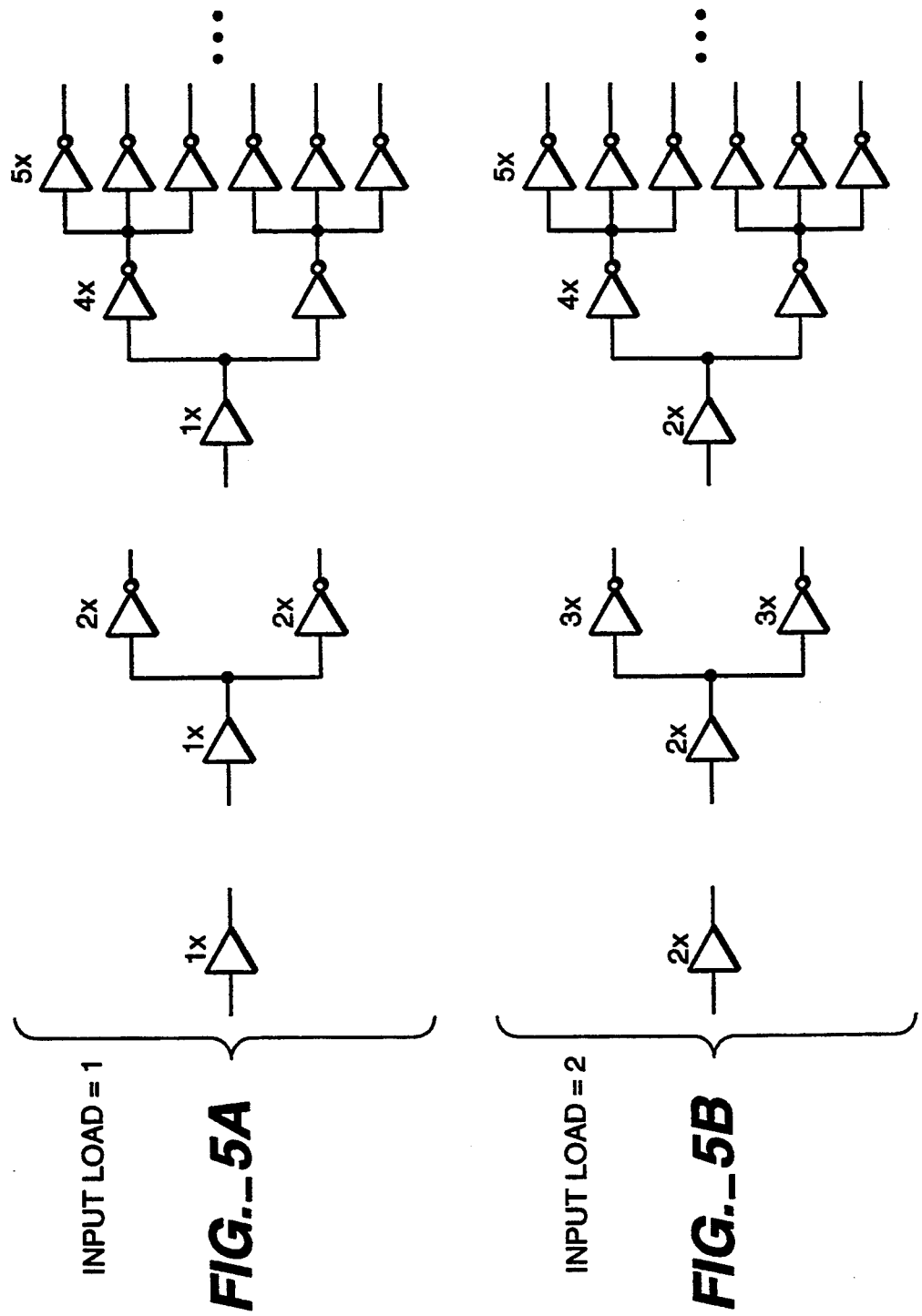
FIG._5A  FIG._5B

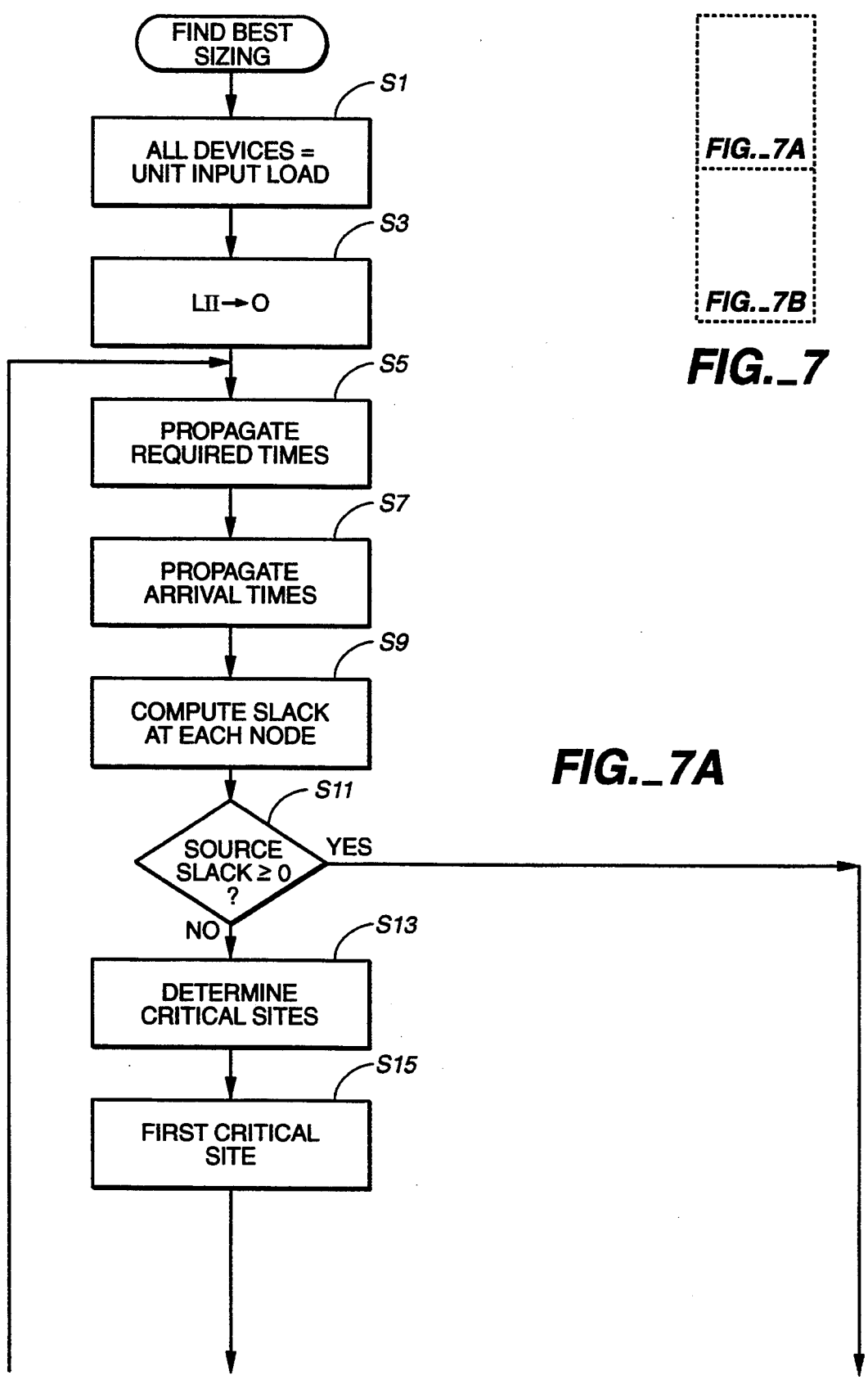
FIG._7A

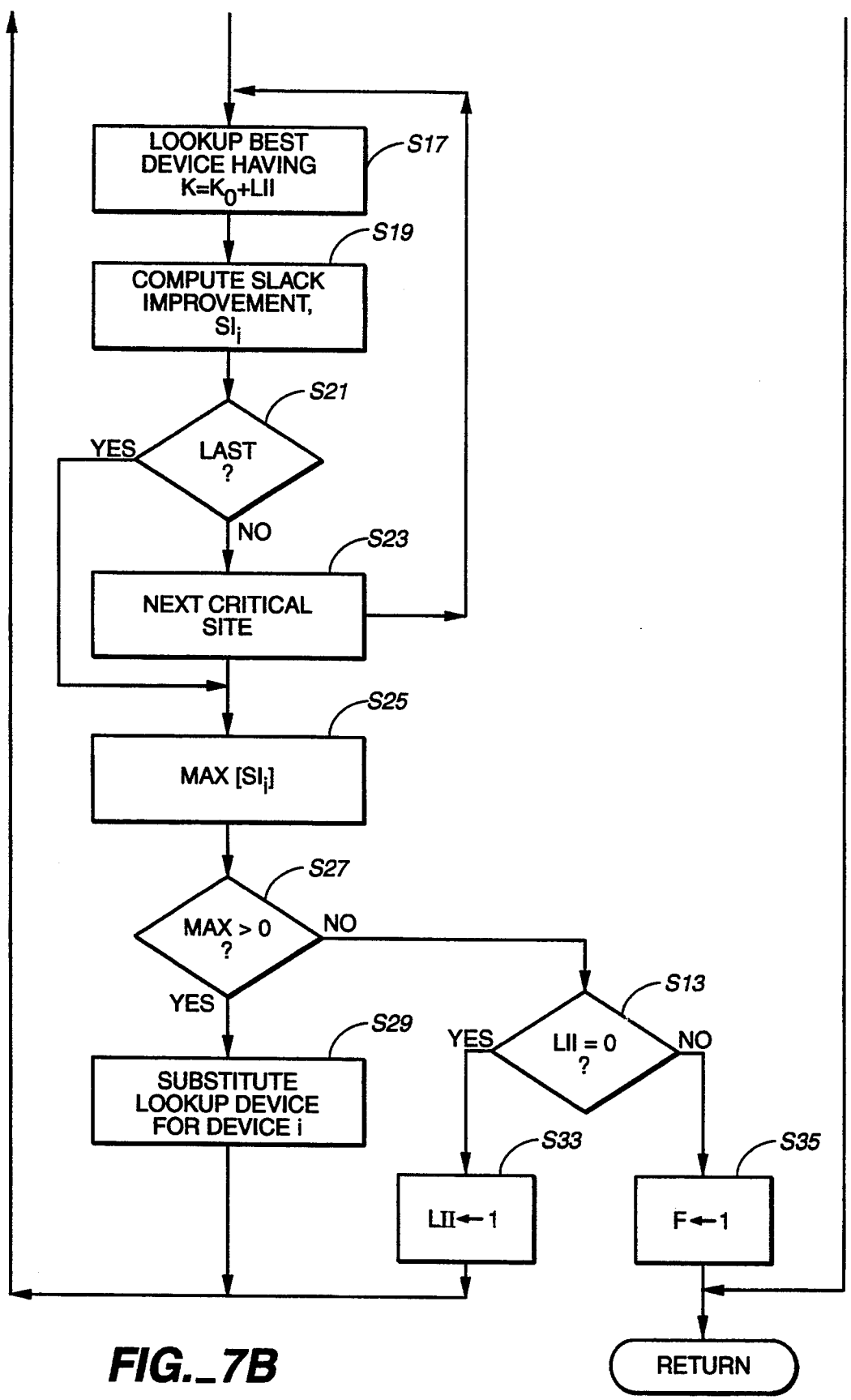
*FIG._7B*

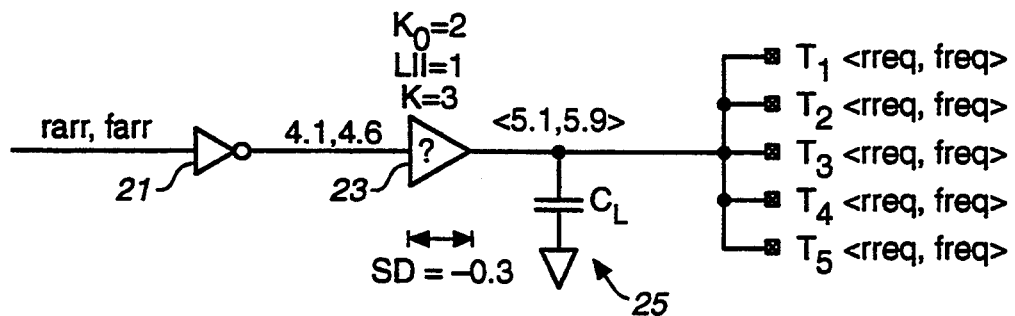
FIG._8
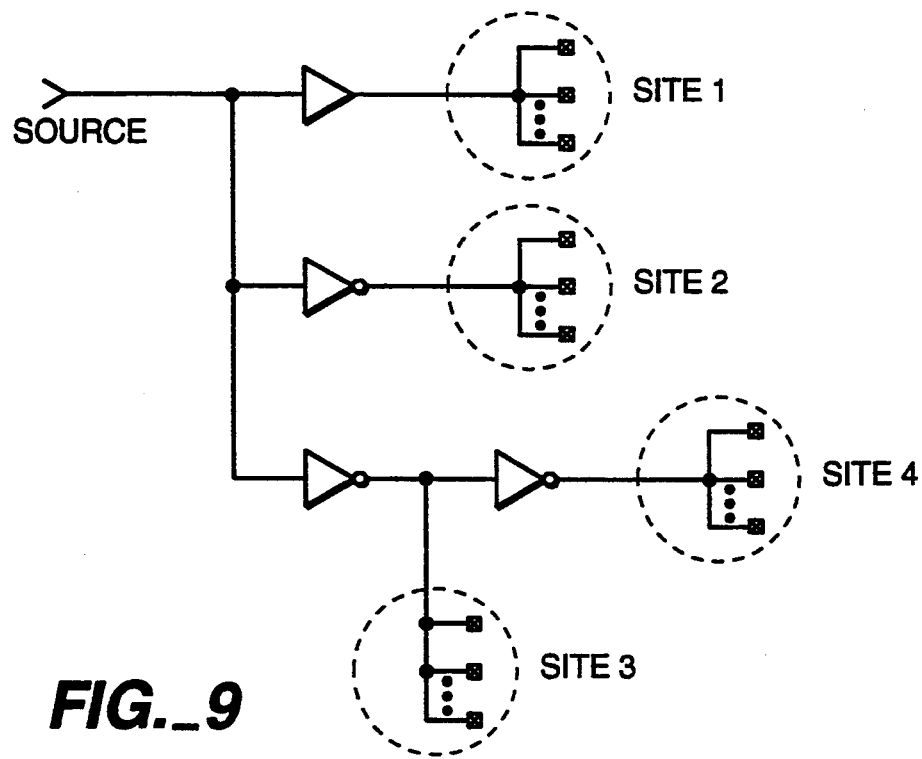
FIG._9

BUFFER CIRCUIT DESIGN USING BACK TRACK SEARCHING OF SITE TREES

BACKGROUND OF THE INVENTION

1. Field of the Invention

The present invention relates to the design of buffer circuits in integrated circuit design and more particularly to a design methodology for designing a buffer circuit that meets specified timing constraints, without making the circuit larger than required.

2. State of the Art

In logic synthesis, automated logic design using a library of standard cells, it is often necessary to provide a signal produced at a particular circuit node to multiple other circuit nodes. The term "fanout" is to describe the forgoing situation; i.e., a signal is fanned out to several and perhaps a multitude of different circuit nodes. Each of the circuit nodes may represent different capacitive loads and may have associated therewith timing constraints in relation to the signal that must be met. In FIG. 1 for example, the output of a NAND gate 11 is designated as a source signal S and is provided in its true form to a terminal T2 and a terminal T4 of AND gates 17 and 23, respectively, and in its inverted form via inverters 15 and 21 to a terminal T1 and a terminal T3 of an AND gate 13 and an OR gate 19, respectively.

Buffer synthesis is an area of logic synthesis that concerns itself with designing a buffer circuit to fan out a signal to multiple signal nodes, providing the necessary drive to meet the timing constraints of each of the nodes while minimizing the size and power consumption of the buffer circuit.

In more precise terms, the task of buffer synthesis is to synthesize a subnetlist which propagates a signal to a number of destinations, in positive or inverted form as specified for each destination, subject to timing and area constraints. The subnetlist is to be constructed using cells from a specified library of cells. Typically, the cells used will consist just of buffer cells and inverter cells.

The simplest way to build a buffer is to connect the source directly by wires to all destinations requiring a non-inverted signal and to the input of a single inverter cell whose output is connected by wires to all destinations requiring an inverted signal. However, this approach could be unacceptably slow if there are a large number of destinations. In general, one needs to add additional inverter or buffer cells to meet the timing constraints.

The inputs to buffer synthesis are:

1. A list of signal names, including one "source signal" and one or more destination signals or "terminals". Each terminal is identified as either a "positive terminal" or a "negative terminal". The "polarity" of a terminal is its status of being positive or negative.
2. For each terminal, there are specified two times (a "rising required time" and a "falling required time") and a load capacitance.
3. For the source signal, there are specified two times (a "source unloaded rising arrival time" and a "source unloaded falling arrival time"), and two numbers (a "source rising ramp factor" and a "source falling ramp factor"). The ramp factors express the drive strength of the source in units of nanoseconds per picofarad.
4. A list of library cells, together with capacitance and timing parameters for each cell. Commonly this list consists of just buffer cells and inverter cells. For definiteness, the following description assumes that each cell is either a one-input one-output non-inverting buffer cell or a one-input one-output inverter cell, and that the parameters of each cell consists of an input capacitance, an output capacitance, an area, a rising propagation delay, a falling propagation delay, a rising ramp factor, and a falling ramp factor.

In practice, the list of library cells, input (4), is fixed for the duration of the logic synthesis process, during which time the buffer syntheses process will be performed many times with differing choices for inputs (1)-(3).

The output of the buffer synthesis process is a subnetlist, which serves to propagate the source signal to all the terminals. The source signal is propagated in non-inverted form to each positive terminal and in inverted form to each negative terminal. The subnetlist is composed of cells from the list of library cells and may also utilize directly wired connections from the source to a terminal. In practice, it is desirable for the netlist to have the form of a tree, with the root of the tree being the source signal, the leaves of the tree being the terminals, and with a library cell placed at each internal node of the tree. The source signal and the output pins of the cells are each connected to one or more fanout points, where a fanout point may be either a terminal or the input pin of another cell.

If possible, the subnetlist produced will meet the timing constraints. That is, the arrival times (rising and falling) at each terminal will be no later than the corresponding required times (rising and falling) for that terminal, when delays through the subnetlist are computed by the following rules:

1. The rising (falling) arrival time for the source signal equals the rising (falling) source unloaded arrival time plus the product of the rising (falling) source ramp factor and the total capacitance (that is, the sum of all cell input capacitances and terminal load capacitances) driven by the source signal.
2. The rising (falling) arrival time for the output of a buffer cell equals the rising (falling) arrival time of its input plus the rising (falling) propagation delay for the cell, plus the product of the rising (falling) ramp factor for the cell and the total capacitance driven by the cell output.
3. The rising (falling) arrival time for the output of an inverter cell equals the falling (rising) arrival time of its input plus the rising (falling) propagation delay for the cell, plus the product of the rising (falling) ramp factor for the cell and the total capacitance driven by the cell output.

The overall goal is to produce a subnetlist that meets the timing constraints and, subject to meeting these constraints, has the smallest possible area, where area is defined as the sum of the areas of all the cells in the subnetlist.

Wire propagation delays (that is, the time it takes a signal to propagate through the interconnecting wires) are not explicitly considered in this process. In fact, in the usual logic synthesis design flow, individual wire lengths are not specified at the time of logic synthesis, but are determined afterward by routing software. Allowance can be made for expected wire delays by adjustments to this method; for example, by adding some fixed additional capacitance to the capacitance of each fanout point.

The input data for an example of a buffering problem are set forth in Table 1 below:

TABLE 1 source rising ramp factor = 2.90
source falling ramp factor = 2.20
source unloaded rising arrival time = .30
source unloaded falling arrival time = .30
number of terminals = 4

| terminal | polarity | load capacitance | rising reg-time | falling reg-time |
|---|---|---|---|---|
| T1 | pos | .300 | 2.0 | 1.7 |
| T2 | pos | .300 | 3.6 | 3.8 |
| T3 | pos | .300 | 4.3 | 3.7 |
| T4 | neg | .300 | 4.8 | 4.0 |

| library cell | rise prop delay | rise ramp factor | fall prop delay | fall ramp factor | input pin cap | output pin cap |
|---|---|---|---|---|---|---|
| inverters: | | | | | | |
| in01d1 | 0.33 | 2.91 | .21 | 1.31 | .100 | .090 |
| in01d2 | 0.26 | 1.51 | .17 | .67 | .200 | .100 |
| in01d3 | 0.22 | 1.03 | .16 | .46 | .303 | .178 |
| buffers: | | | | | | |
| ni01d1 | 0.64 | 2.90 | .96 | 1.20 | .100 | .090 |
| ni01d2 | 0.72 | 1.51 | 1.34 | .68 | .100 | .100 |
| ni01d3 | 0.86 | 1.01 | 1.70 | .48 | .100 | .240 |

A possible buffering solution which might be produced is shown in FIG. 2.

In the buffering solution of FIG. 2, the various arrival times are as set forth in Table 2 below

TABLE 2

| source | rising = .30 + 2.90*(.300 + .200) = 1.75 |
| | falling = .30 + 2.20*(.300 + .200) = 1.40 |
| T1 | same arrival times as source |
| T4 | rising = 1.40 + 0.26 + 1.51*(.100 + .300 + .303) = 2.75 |
| | falling = 1.75 + 0.17 + 0.67*(.100 + .300 + .303) = 2.39 |
| T2 | rising = 2.39 + 0.22 + 1.03*(.178 + .300 + .300) = 3.41 |
| | falling = 2.75 + 0.16 + 0.46*(.178 + .300 + .300) = 3.24 |
| T3 | same arrival times as T2 |

It can be seen that the buffering is successful, because all terminal arrival times are less than or equal to the corresponding required times.

Buffer design often requires design engineers to draw upon their previous design experience and accumulated expertise. Attempts to fully automate buffer design, i.e., provide a general-purpose buffer synthesis tool, have been fraught with difficulties in that the number of possible solutions to a buffering problem increases exponentially with the number of terminals to which the signal is to be applied. Proposed solutions to the fanout problem are presented in the following references:

C. Leonard Berman and J. Lawrence Carter. "The Fanout Problem: From Theory to Practice". Advanced Research In VLSI, Proceedings of the Decennial CalTech Conference on VLSI March 1989, ed. Charles L. Seitz, 69–99.

Kanwar Jit Singh and Alberto Sangiovanni-Vincentelli. "A Heuristic Algorithm for the Fanout Problem". 27th ACM/IEEE Design Automation Conference, 1990, 357–360.

Herve J. Touati, Cho W. Noon, Robert K. Brayton, and Albert Wang. "Performance-Oriented Technology Mapping". Advanced Research In VLSI, Proceedings of the Sixth MIT Conference, 1990, ed. William J. Dally, 79–97.

As discussed in the foregoing references, one way to deal with the computational complexity of the fanout problem is to limit choices for the buffer circuit to a few fixed trees, chosen in advance. For each tree tried, the terminals, ordered by required time, may be assigned to the leaves of the tree in some fixed order, and a heuristic approach may be used for choosing cells to place at each internal tree node. Another approach is to use a rule-based system, wherein, starting from some initial non-optimal buffering solution, a set of transformation rules is repeatedly applied. Each application of a rule causes some pattern in the existing buffer to be replaced by some other pattern, according to the rule. Usually, the buffer that exists after applying a rule is more optimal than the previously existing buffer.

SUMMARY OF THE INVENTION

According to the present invention, a buffer circuit for fanning out a source signal to a plurality of terminals of specified polarities in accordance with specified time constraints is designed by an automated method in which a circuit template is specified in terms of a tree structure receiving said source signal at a root thereof representing a source node, each additional node of said tree structure forming the site of a generalized inverting or non-inverting buffer, certain ones of said nodes being designated as potential terminal sites of positive and negative polarities, each of the terminal sites having a designated priority level such that terminal sites close to the source node have a higher priority level than terminal sites more distant from the source node. The terminals are ordered in increasing order of required arrival times of the source signal at each of the terminals. A first terminal in a resulting order is assigned to a highest-level potential terminal site of a same polarity as said first terminal, and buffer circuits are specified for buffer sites on a signal path between said first terminal and the source signal and sized so as to satisfy, if possible, a required arrival time of the source signal at said first terminal. So long as required times of arrival are met, additional terminals are placed in like manner. When the sizing operation is unable to satisfy required arrival times given a particular placement of terminals, the placement of the last terminal to be placed is undone and the placement of a previously placed terminal is adjusted to a lower-level site. The method therefore proceeds as far as possible using a straight-forward assignment procedure of terminals to potential terminal sites, then backtracks, undoing so much of the previous assignments as necessary and making incremental adjustments to allow the method to proceed further if possible. The method is completed when either all terminals have been successfully assigned or all of the previous assignments have been undone.

BRIEF DESCRIPTION OF THE DRAWINGS

The present invention can be further understood with reference to the following description in conjunction with the appended drawings. In the drawings:

FIG. 1 is an example of a logic circuit in which a source signal is fanned out to a number of terminals;

FIG. 2 is an example of a buffer circuit that solves the fanout problem presented in Table 1 above;

FIG. 3 is a logic diagram of a model buffer circuit represented as a site tree;

FIG. 4 is a flow chart of a backtrack search procedure used to assign terminals to potential terminal sites;

FIG. 5a is a set of logic diagrams of generalized buffers having an input load of one unit;

FIG. 5b is a set of logic diagrams of generalized buffers having an input load of two units;

FIG. 6 is a graph of delay versus load capacitance for selected buffer circuits;

FIG. 7 includes FIGS. 7A and 7B;

FIGS. 7a and 7b are flow chart of a sizing procedure used to select an appropriate generalized buffer for each utilized buffer site in the site tree of FIG. 3;

FIG. 8 is a logic diagram illustrating considerations in selecting a generalized buffer for a particular buffer site; and FIG. 9 is a logic diagram of an example of an alternate model buffer circuit represented as a site tree.

DETAILED DESCRIPTION OF THE PREFERRED EMBODIMENTS

Referring now to FIG. 3, the present method considers as potential buffering solutions to each fanout problem buffering circuits of a form as shown. The source signal is applied to a first buffer pair including a non-inverting buffer NI1 and inverting buffer IN1, either directly or after having being buffered in an optional non-inverting buffer NI0. The output of the first inverting buffer IN1 is in turn input to a second buffer pair NI2 and IN2, the output of IN2 being input to a third buffer pair NI3 and IN3, etc.

The buffers NI and IN represent generalized buffers, i.e. any circuit that produces the logical equivalent or logical inverse of the source signal. These generalized buffers may be realized by a single buffer stage or multiple buffer stages with each buffer stage being realized by a single device or multiple identical devices connected in parallel. A generalized buffer may therefore be represented in the following form:

```
input:  comp1—comp2—comp3—comp4 ... :outputs
         (n1)   (n2)   (n3)   (n4)  ... :
```

A number n1 of a first component comp1, either a buffer cell or an inverter cell from the library, are wired together to receive the same input signal and to produce a common output signal or equivalent output signals to a number n2 of a second component comp2, and so forth. If the list of components contains an odd number of inverters, then the generalized buffer will produce an output signal which is inverted from its input signal and is therefore an inverting generalized buffer. Otherwise, the generalized buffer is non-inverting.

The source signal itself (either directly or buffered by the buffer NI0) and the outputs of each of the buffers NI and IN provide potential sites (positive and negative) to which terminals may be assigned. Any number of terminals may be assigned to a particular site; i.e., there is no limit per se to the number of terminals that may be assigned to a particular site. The sites are numbered with the same number used to designate the respective buffers, sites at the outputs of non-inverting buffers being designated by positive numbers and sites at the outputs of inverting buffers being designated by negative numbers. The unsigned value of the site number is indicative of the number of generalized buffers on a path between the site and the source signal. Sites of different levels are therefore provided, sites of a lower level being closer to the source signal than sites of a higher level. The number of levels may be either a fixed finite number or may be variable, depending on CPU load, for example. By confining attention to buffering solutions that may be represented in accordance with the template of FIG. 3, the fanout problem is made tractable.

Each of the buffers of FIG. 3 produces an output signal delayed with respect to, but of greater drive capability than, its input signal. The delay associated with the buffers accumulates from level to level. The different sites therefore provide a range of output signals from "fast" signals near the source (not significantly delayed with respect to the source signal) to "slow" signals at higher levels.

To assign terminals to appropriate sites, the terminals are first sorted in order of increasing arrival time. In general, a first terminal having an earliest required arrival time is first assigned to the lowest-level site of the same polarity. For example, if the first terminal is of positive polarity, then the terminal would be assigned to site as 0, else if the terminal is of a negative polarity, then the terminal would be assigned to site 1. Actual generalized buffer circuits are then chosen for each of the buffer sites on a path from the first terminal site to the source signal in an attempt to find a partial buffering solution that satisfies the required arrival time of the first terminal.

Assuming a partial buffering solution is found, a next terminal is likewise assigned. If the next terminal is of the same polarity as the first terminal, then the next terminal will be assigned to the same site. Buffer circuits are then chosen in an attempt to find a new partial buffering solution. When a new partial buffering solution cannot be found, the last-assigned terminal is "demoted" until a new partial buffering solution can be found or until it cannot be demoted any farther and is therefore caused to be unassigned. If a partial buffering solution still cannot be found, the next lowest priority terminal is demoted, and so forth.

The backtrack search method may be described more precisely in terms of the following steps, framed in the imperative:

1. Sort the list of terminals in order of increasing required time. This is called the "sorted terminal list".

Since each terminal typically has two required times (rising and falling) some choice must be made as to how to sort them. One choice is to sort them in order of the lesser of rising required time and falling required time.

The following steps 2 and 3 assign terminals to terminal sites according to their order in the sorted terminal list, so that at any point in the process a certain number of terminals from the start of this list will have been assigned, and all terminals following the assigned terminals in the list will be unassigned. The assignment process preserves the order of terminals in the sorted terminal list, so that if terminals t1 and t2 have the same polarity and t1 comes before t2 in the sorted terminal list, t2 will not be assigned to a site that precedes the site of t1 in the site priority ordering for that polarity. The "site priority ordering" for positive polarity is the list of positive sites in order of increasing level (that is: 0, 1, −2, 3, ... ). The "site priority ordering" for negative polarity is the list of negative sites in order of increasing level (that is: −1, 2, −3, 4 ... ).

2. Turn the FAILED flag off.
3. Perform the following substeps repeatedly until either substep (a) stops with a successful result or substep (c) stops with an unsuccessful result:
   (a) If the FAILED flag is off and all terminals are assigned, STOP—the buffer synthesis has succeeded.
   (b) If the FAILED flag is off and not all terminals are assigned, take the first unassigned terminal from the sorted terminal list and assign it to the first acceptable site.
   The definition of "first acceptable site" for an unassigned terminal t1 is as follows: If no terminal with the same polarity as t1 is yet assigned, the first acceptable site for t1 is the first terminal site in the site priority ordering for that polarity. If some terminal with the same polarity as t1 is already assigned, the "first acceptable site" for t1 is the terminal site to which the most recently assigned terminal of the same polarity as t1 is assigned.
   By the "most recently assigned" terminal is meant the currently assigned terminal which was most recently assigned to a site, excluding any terminal that has been recently assigned but is now unassigned. It will be noted that the most recently assigned terminal is also the last (in the ordering of the sorted terminal list) currently assigned terminal.
   (c) If the FAILED flag is on and no terminals are assigned, STOP—the buffer synthesis has failed.
   (d) If the FAILED flag is on and there is a next acceptable site for the most recently assigned terminal, reassign the most recently assigned terminal from its current site to the next acceptable site.
   The definition of "next acceptable site" for a terminal t1 is as follows: If the currently assigned site of t1 is not the last site in the site priority ordering for that polarity, the next acceptable site for t1 is the site which follows the current site of t1 in that site priority ordering. Otherwise there is no next acceptable site for t1.
   (e) If the FAILED flag is on and there is no next acceptable site for the most recently assigned terminal, unassign the most recently assigned terminal, so it is again an unassigned terminal, and skip substep (f).
   (f) Execute procedure findBestSizing, which seeks to find an assignment of generalized buffers/inverters to the currently utilized buffer/inverter sites that meets the timing constraints of all currently assigned terminals. If this procedure succeeds, turn the FAILED flag off, otherwise turn the FAILED flag on.

The foregoing procedure may be better understood with reference to FIG. 4. In a first step S1, the terminals are sorted in order of increasing arrival time and a failed flag F, indicative of whether the method is unable to identify a partial buffering solution for a subset of terminals already assigned, is reset. At the outset, since the failed flag will have just been reset and no terminals will have been assigned, the tests of steps S3 and S5 will both produce negative results. Beginning then in step S7, a highest-ranked terminal is assigned to a lowest-level compatible site. In step S9, a routine findBestSizing is executed, searching for a partial buffering solution that satisfies the required arrival times of all assigned terminals. If a partial buffering solution is found, the failed flag F remains reset. If the routine findBestSizing were always successful, the program steps S7, S9, S3 and S5 would be repeatedly executed in sequence until all terminals had been successfully assigned as determined in step S5, at which point a complete buffering solution would have been found and the program would return.

In all but the most exceptional cases, however, the routine findBestSizing is liable to fail repeatedly, causing the failed flag F to be set and requiring the search to backtrack, reassigning and even unassigning the previously assigned terminals. When the failed flag F is set as determined in step S3, assuming that one or more terminals remain assigned as determined in step S11, the determination is made in step S13 as to whether a next lower level compatible site for the last-assigned remaining terminal exists. If so, that terminal is reassigned to the next available site in S15. The routine findBestSizing is then re-executed in step S9. If a partial buffering solution is found, then the "successful" loop consisting of steps S3, S5, S7 and S9 is resumed, otherwise steps S13 and S15 are repeated for so long as a next available site may be found.

When a next available site does not exist as determined in step S13, the last-assigned terminal is unassigned in step S19 and control passes to step S11 (through step S3). If there are terminals still assigned (step S11), then a determination is made in step S13 whether a next available compatible site exists for the last-assigned remaining terminal. If so, that terminal is reassigned in S15. A terminal whose assignment renders impossible the finding of a partial buffering solution therefore causes in the extreme case not only its own demotion and ultimate unassignment, but also the demotion of a terminal assigned at a next-earlier time. If a partial buffering solution is found in step S9, the "errant" terminal may then be reassigned in hopes that the backtracking and adjustment has now made a buffering solution possible. Operation proceeds in this manner until either all terminals have been successfully assigned as determined in step S5 or none of the terminals remain assigned as determined in step S11.

It may be appreciated that the foregoing method provides a more or less exhaustive search of all order-preserving assignments of terminals to terminal sites. The number of repetitions of step S9 in FIG. 4 may be quite large, so it is important for the procedure findBestSizing, to be described hereafter, to be as efficient as possible, In the event that the foregoing method fails to find a buffering solution, the timing constraints may be relaxed somewhat by subtracting some fixed amount from the source unloaded arrival times, and the procedure may be tried again with this less constrained version of the problem. If the constraints are relaxed enough times, a buffering solution will be found but one that probably will not meet the original timing constraints.

The task of the procedure findBestSizing is to chose a generalized buffer (inverter) to be placed at each utilized buffer (inverter) site so as to meet the timing constraints of all currently assigned terminals. The term "sizing" refers to any assignment of generalized buffers and inverters to the utilized buffer and inverter sites, whether or not this assignment meets the timing constraints. Generalized buffer circuits available to be assigned to a buffer site include buffer circuits available in a standard cell library and buffer circuits built up from buffer circuits found in the standard cell library.

For example, the standard cell library might include five different sizes of non-inverting buffer circuits and five different sizes of inverting buffer circuits designated 1X to 5X from smallest to largest. A 1X buffer circuit has a smaller input capacitance and a smaller drive capability than a 2X buffer circuit, etc. Furthermore, a 2X buffer circuit has approximately twice the input capacitance of a 1X buffer circuit, a 3X buffer circuit has approximately three times the input capacitance as the 1X buffer circuit, and so forth. More complex buffer circuits may be built up from the simple buffer circuits available in the standard cell library. These complex buffer circuits implement "balanced" fanouts only; that is, they are constructed symmetrically and are used to drive a number of outputs with essentially the same delay. All of the buffer circuits are placed in separate lists according to their input capacitance as shown in FIGS. 5a and 5b.

The complex buffer circuits need not be specified by a designer but may be computer-generated by exhaustively enumerating every possible balanced fanout buffer circuit of up to a given number of stages that may be realized using the standard library cells, evaluating the characteristics of the resulting buffer circuit in terms of input capacitance and drive capability, and storing in lists of the type shown in FIG. 5 only those buffer circuits that differ substantially in their characteristics from previously computed buffer circuits, thereby eliminating duplicative buffer circuits.

More particularly, the foregoing lists are built by systematically enumerating all possible generalized buffers and inverters, subject to fixed bounds on multiplicity and number of stages. For each such generalized buffer or inverter, the parameters of input and output capacitance, rising and falling propagation delay, and rising and falling ramp delay, are computed. These parameters describe the capacitance and timing behavior of the generalized buffer or inverter, viewed as if it were a single cell. For example, the input capacitance of a generalized buffer is just the total input capacitance of the first-stage components, and its rising ramp factor is the rising ramp factor of a final-stage component divided by the multiplicity of the final stage. Based on these parameters, those generalized buffers and inverters which offer no advantage or only insignificant advantage over others in the list can be identified and deleted, thereby producing a list of manageable size.

Depending on the maximum multiplicity and maximum number of stages, it may not be feasible to exhaustively enumerate the possible generalized buffers and inverters. In this case, the enumeration must be limited in some way. A useful expedient is to restrict the multiplicities n1, n2, . . . to values such that each is an exact multiple of the preceding. Also, at higher depths, one may further restrict the ratio of successive multiplicities to be one specific value, which has been found to be the most effective fanout for driving large loads.

The list-building process can build on itself in recursive fashion for greater efficiency. For example, suppose we want to find generalized buffers whose final stage consists of, say, 12 instances of a particular buffer cell in parallel. Let CO be the total input capacitance of these 12 instances. Then, the choice of preceding stages for the generalized buffer can be limited to those previously found generalized buffers which have the required input load index and which are useful for driving the load CO.

Also stored in the lists along with each buffer circuit are the upper and lower bounds of a range of load capacitances for which that buffer circuit may be expected to perform a better than other buffer circuits within the same list. This idea may be better understood with reference to FIG. 6. In FIG. 6, signal delay in nanoseconds is plotted versus output load capacitance for four different buffer circuits. A smallest buffer circuit (ni01d1) has a small intrinsic delay at minimum output load. As the output load increases, however, signal delay rises steeply because of the small drive capability of the buffer circuit. A next larger buffer circuit will have a greater intrinsic delay but a more favorable delay/load slope. A range of load capacitances may therefore be identified for which a particular buffer circuit is best suited. As shown in FIG. 6, for example, the buffer circuit ni01d5 is better suited for load capacitances within a range bracketed by the dotted lines then any of the other buffer circuits represented in the FIGURE.

Using the foregoing lists, the procedure findBestSizing, working from an initial sizing, tries at each step to find a buffer circuit substitution that will yield the greatest improvement (slack improvement) toward meeting the specified time constraints until the time constraints have been met or have been determined to be impossible to meet, The procedure findBestSizing is therefore a rather straightforward "greedy" algorithm, which repeatedly finds the most lucrative substitution and makes it.

The procedure findBestSizing consists of the following steps:

1. Initially, place a unit-input-load inverter cell at every utilized inverter site, and a unit-input-load buffer cell at every utilized buffer site in the site tree. (If there is more than one such cell in the library, place the one that has the smallest size. If the library does not contain a unit-input-load buffer cell, use instead two unit-input-load inverters in series.)
2. Set loadIndexIncrement=0
3. Repeat the following substeps, until either substep (d) stops with a successful result, or substep (f) stops with a failing result.
   (a) Propagate required times from the terminals to all tree nodes as a function of the current sizing.
   (b) Propagate arrival times from the source to all tree nodes as a function of the current sizing.
   (c) Compute the rising and falling slack at each tree node, by subtracting the rising (falling) arrival time from the rising (falling) required time for the node.
   (d) If both rising and falling slack of the source node are greater than or equal to zero, STOP—the buffering is successful.
   A buffer/inverter site is defined to be "critical" if either the rising or falling slack at its output equals the lesser (i.e. more negative) of the rising slack and falling slack of the source node.
   (e) For each critical utilized buffer site, find, in the list of generalized buffers whose input load index equals the sum of loadIndexIncrement and the input load index of the generalized buffer currently at the site, the generalized buffer which maximizes the slack at the output of the site, where by "slack" means the lesser of rising slack and falling slack. Similarly, for each critical utilized inverter site, find, in the list of generalized inverters whose input load index equals the sum of loadIndexIncrement and the input load index of the generalized inverter currently at that site, the generalized inverter which maximizes the slack at the output of the site. A procedure for retrieving the desired generalized buffer or inverter from the list is described below.

At each of these sites, compute the "slack improvement" by subtracting the slack at the output of the generalized buffer/inverter currently at that site from the slack given by the newly found generalized buffer/inverter.

(f) If the preceding substep found no substitution giving a slack improvement greater than 0, then:
  i) if loadIndexIncrement=0, then set loadIndexIncrement=1 and skip substep (g).
  ii) if loadIndexIncrement is not 0, STOP—buffering has failed to meet the timing constraints.

(g) At the buffer or inverter site where the greatest slack improvement was found, substitute the generalized buffer/inverter which gave that improvement for the one currently placed there.

The foregoing procedure may be better understood with reference to FIGS. 7a and 7b. In steps S1 and S3, all of the utilized devices are specified to be unit input load devices of the smallest available size, and the load index increment LLI is set to 0. The method then begins the first of two stages of improvement.

During the first stage of improvement (while LII=0), timing is improved without increasing the input capacitance of any site. In steps S5, S7 and S9, the slack at each node is computed by propagating required times from the leaves of the tree structure back to the root and propagating arrival times from the root forward to the leaves with respective arrival times being subtracted from respective required times to give respective slack figures. If in step S11 it is determined that the slack at the source is positive or 0, then the initial buffering solution using minimum-size, unit-input-load cells is successful and the procedure concludes. Otherwise, critical buffer sites are determined in step S13 as those buffer sites have which either rising or falling slack at the output equal to the lesser of rising slack and falling slack of the source node. In other words, critical sites are those requiring that no slack penalty be incurred along the path from the source to the critical site.

Then, in steps S15, S17, S19, S21 and S23, the look-up tables storing the generalized buffers and associated information are accessed to find a device having an input load index K greater by the load index increment LII (zero in the first stage) than the input load index $K_0$ of the device already specified for the site under consideration and that will give the greatest slack improvement at that site. The slack improvement, $SI_i$, is calculated in step S19. Then in step S25, the maximum value of the slack improvements calculated is determined, and if that maximum is greater than 0 as determined in step S27, then the device looked up from the tables is substituted for the device i in step S29. Since the substitution will have affected arrival times and required times, the arrival times are again propagated to each node in step S7 and the slack computed at each node in step S9. If the slack at the source node is positive or 0, then a successful buffering solution has been found. Otherwise, the procedure continues to look for the next most lucrative substitution.

This process continues until either a successful buffering solution has been found or no further slack improvement may be achieved as determined in step S27. Once no further slack improvement may be achieved, if the load index increment LII is 0 as determined in step S31, LII is then set to 1 in step S33, beginning a second stage.

During the second stage of improvement (while LII=1), timing improvements are made at sites at the cost of a quantum increase in the input capacitance of the site. In other words, a substitute device is sought among devices having an input load index one greater than the input load index of the current device. This increase in input capacitance may slow down some other path, but even if that other path is critical or nearly critical, the net result of the substitution is usually an improvement in overall slack.

The advantage of making improvements in small "quantum" steps is that upward sizing stops as soon as the time constraints are met. Therefore, the circuit is not made any larger than it needs to be.

If no successful buffering solution is found even with LII=1, and no further slack improvements may be achieved as determined in step S7, then in step S35 the failed flag F is set and the procedure concludes unsuccessfully.

Because of the potentially very high number of iterations of the procedure findBestSizing to be performed, it is important that the procedure findBestSizing be able to find quickly in the buffer look-up tables the buffer having a given input capacitance that will result in the greatest slack improvement at a particular buffer site. This retrieval operation may be performed quickly using, in addition to an indication of the range of load capacitances for which a buffer circuit is useful, an additional concept referred to as "slack delta", to be explained in connection with FIG. 8. As with load capacitance, the bounds of a range of slack deltas for which a particular buffer circuit is useful are also stored together with each buffer circuit in the buffer look-up tables.

Referring now to FIG. 8, assume that a generalized buffer 23 is driven by a generalized inverter 21 and drives a capacitive load 25 representing the capacitive load of a number of terminals $T_1-T_5$ connected to the output of the buffer 23. Assume further that the buffer 23 has an input load index $K_0$ of 2 but that procedure findBestSizing, operating in the second stage of improvement with LII=1, is attempting to find a generalized buffer of input load index K=3 that gives the greatest slack improvement in the output of the buffer 23. Each of the terminals $T_1-T_5$ has associated therewith a rising required time rreq and a falling required time freq. The required rising time at the output of the buffer 23 is the earliest of the required rising times of the terminals $T_1-T_5$; likewise, the required falling time at the output of the buffer 23 is the earliest of the required falling times of the terminals $T_1-T_5$. For purposes of the present example, assume that the required rising time is 5.1 and the required falling time is 5.9.

The inverter 21 has associated with its input a rising arrival time rarr and a falling arrival time farr. These times are increased by propagation through the inverter 21, resulting in a rising arrival time and a falling arrival time at the input of the buffer 23. For purposes of the present example, these times are assumed to be 4.1 and 4.6, respectively.

Slack gap is the difference between the respective required times at the output of the buffer 23 and the respective arrival times at the input of the buffer 23. The rising slack gap is therefore $5.1-4.1=1$, and the falling slack gap is $5.9-4.6=1.3$. Slack delta SD is equal to the rising slack gap minus the falling slack gap. In the present example, $SD=1.0-1.3=-0.3$. One interpretation of slack delta is how much longer a rising signal may take to propagate through the buffer 23 than a falling signal may take without adversely affecting slack in absolute terms. In other words, since slack is defined as the lesser of rising slack and falling slack, in the example of FIG. 8, a successful buffering solution can afford to have buffer 23 having a falling delay 0.3 greater than its rising delay so long as it achieves the best improvement in rising slack of all the buffer circuits in its list.

In more precise terms, "slack delta" is defined as the difference between the "rising slack gap" and the "falling slack gap". For a buffer site, the rising slack gap is defined as the rising required time at the output of the buffer site, minus the rising arrival time at the input of the buffer site, minus the product of the rising ramp factor at the input of the buffer site and the "input-cap delta". The input-cap delta is defined as the input capacitance corresponding to the given input load index minus the input capacitance of the generalized buffer currently at the site and is used as an adjustment factor when the input capacitance of a buffer differs somewhat from the specified input capacitances according to which the buffers are grouped. For an inverter site, the rising slack gap is defined as the rising required time at the output of the site, minus the falling arrival time at the input of the site, minus the product of the falling ramp factor at the input of the site and the input-cap delta. The falling slack gap is defined in the same way, exchanging the words "falling" and "rising".

Given that the best choice in any situation depends on just these two parameters, look-up schemes that partially or wholly avoid the need to search through the list may be readily devised.

A possible look-up scheme consists of the following steps. For each generalized buffer or inverter in each of the lists, a processor is used to pre-compute and store the minimum and maximum load capacitance for which the buffer or inverter is useful, and also the minimum and maximum slack delta for which it is useful. To find the best choice for a given load and slack delta within a given list, the list is scanned in linear order. For each item scanned, whether the given load capacitance is between the pre-computed minimum and maximum load capacitance for that item is tested, as is whether the slack delta is between the pre-computed minimum and maximum slack delta for that item. If either load capacitance or slack delta is not within the pre-computed range, the item is ignored. If it is within this range, the timing parameters of the item are used to compute the slack which would result from using this item. After all items have been scanned, the one which gave the greatest slack is selected for use.

A more elaborate look-up scheme could take advantage of the fact for each generalized buffer or inverter in each of the lists, the range of values of load capacitance and slack delta for which it is optimal can be defined by a set of linear inequalities, that is, by a set of inequalities of the form $A*loadCap+B*slackDelta<=C$. Thus, with additional preprocessing effort, a decision tree could be generated for each list through which the program could be guided to the optimal list entry through a series of tests of the form $A*loadCap+B*slackDelta<=C$.

The basic method set forth in the foregoing description may be enhanced in various ways. As previously described in connection with FIG. 3, the buffer NI0 at site 0 is optional. Often, a better buffering solution may be obtained by omitting the buffer NI0, replacing it by wired connections from the source to site 0, buffer NI1 and inverter IN1. To determine whether or not the buffer NI0 should be omitted, the procedure findBestSizing is executed twice, first on an alternate site tree template in which the buffer NI0 is absent. If a successful buffering solution is not found, then the procedure findBestSizing is executed again using the standard site tree template with buffer NI0 present.

Other alternate site tree templates are also possible. For example, as shown in FIG. 9, even though a buffer drives another buffer, its output may be a terminal site.

Another enhancement involves the limitation of "next acceptable site" depth. The time needed to execute the backtrack search procedure can often be greatly reduced by setting a maximum level for the "next acceptable site". In other words, if the next acceptable site is of a level greater than some maximum level, the backtrack search procedure considers there to be no next acceptable site. A useful definition of maximum level is two plus the greater of the highest level to which any previous terminal is currently assigned and the level of the first acceptable site for the terminal under consideration. Numerous other definitions are also possible, the essential idea being to avoid moving to a higher level a terminal which has already failed at a lower level, in situations where there is little or no likelihood that such a move will lead to success.

The method as described becomes very time consuming when the number of terminals is greater than about 10 or 12. To alleviate this problem, terminals may be clustered into "terminal groups". Each terminal group forms an inseparable entity—the entire group must always be assigned to a single terminal site. If the total number of groups does not exceed 10, then the behavior of the method with this modification is not much worse than the case where there are only 10 terminals in all. Terminals are clustered into groups according to proximity of their required times, using a straightforward clustering procedure.

The foregoing has described the principles, preferred embodiments and modes of operation of the present invention. However, the invention should not be construed as limited to the particular embodiments discussed. Instead, the above-described embodiments should be considered as illustrative rather than restrictive, and it should be appreciated that variations may be made in those embodiments by workers skilled in the art without departing from the scope of the present invention as defined by the following claims.

What is claimed is:

1. An automated method of designing a buffer circuit for fanning out a source signal to a plurality of terminals of specified polarities in accordance with specified time constraints, comprising the steps of:
   a) specifying a circuit template as a tree structure having a root representing a source node receiving said source signal and having nodes each forming the site of a generalized inverting or non-inverting buffer, a plurality of said nodes being designated as potential terminal sites of positive and negative polarities, respectively;
   b) ordering the potential terminal sites to produce a site order;

c) ordering the terminals to produce a terminal order;
d) for a first terminal in said terminal order, finding a partial buffering solution in which the first terminal is assigned to a particular potential terminal site, and designating the particular potential terminal site as a current potential terminal site;
e) assigning to the current potential terminal site a first unassigned terminal in said terminal order having the same polarity as the first terminal;
f) attempting to find a partial buffering solution with said first unassigned terminal assigned to the current potential terminal site;
g) if no partial buffering solution with said first unassigned terminal assigned to the current terminal site is found, determining whether there exists a next potential terminal site in said site order having the same polarity as the first terminal;
h) if it was determined in step g) that a next potential terminal site in said site order having the same polarity as the first terminal does exist, unassigning said first unassigned terminal and designating the next potential terminal site as the current potential terminal site;
i) if it was determined in step g) that no next potential terminal site in said site order having the same polarity as the first terminal exists, repeatedly unassigning from its previously assigned terminal site a most-recently-assigned terminal until there exists a next potential terminal site after said previously assigned terminal site in said site order having the same polarity as the first terminal or until a failure criterion is satisfied;
j) if it was determined in step i) that there exists a next potential terminal site, then designating said next potential terminal site as the current potential terminal site;
k) repeating step e) through step j) until there is no unassigned terminal in said terminal order having the same polarity as the first terminal or until said failure criterion is satisfied.

2. An automated method of designing a buffer circuit for fanning out a source signal to a plurality of terminals of specified polarities in accordance with specified time constraints, comprising the steps of:
a) specifying a circuit template as a tree structure having a root representing a source node receiving said source signal and having nodes each forming the site of a generalized inverting or non-inverting buffer, a plurality of said nodes being designated as potential terminal sites of positive and negative polarities, respectively;
b) ordering the potential terminal sites to produce a site order;
c) ordering the terminals to produce a terminal order;
d) for a first terminal in said terminal order, finding a partial buffering solution in which the first terminal is assigned to a particular potential terminal site, and designating the particular potential terminal site as a current first-polarity potential terminal site;
e) if a first unassigned terminal in said terminal order has a different polarity than any previously assigned terminal, performing step m);
f) if a first unassigned terminal in said terminal order has the same polarity as the first terminal, assigning the first unassigned terminal to the current first-polarity potential terminal site, else assigning the first unassigned terminal to the current opposite-polarity potential terminal site;
g) attempting to find a partial buffering solution with said first unassigned terminal assigned as in step f);
h) if no partial buffering solution is found, unassigning said first unassigned terminal and determining whether there exists a next potential terminal site in said site order having the same polarity as said first unassigned terminal;
i) if it was determined in step h) that a next potential terminal site in said site order having the same polarity as said first unassigned terminal does exist, designating the next potential terminal site having the same polarity as the first unassigned terminal as either the current first-polarity potential terminal site or the current opposite-polarity potential terminal site;
j) if it was determined in step h) that no next potential terminal site in said site order having the same polarity as said first unassigned terminal exists, repeatedly unassigning from its previously assigned terminal site a most-recently-assigned terminal until there exists a next potential terminal site after said previously assigned terminal site in said site order having the same polarity as said most-recently-assigned terminal, or until a failure criterion is satisfied;
k) if it was determined in step j) that there exists a next potential terminal site, then designating said next potential terminal site as the current first-polarity potential terminal site or as the current opposite-polarity potential terminal site;
l) repeating step e) through step k) until there is no unassigned terminal in said terminal order or until said failure criterion is satisfied;
m) finding a partial buffering solution in which the first unassigned terminal is assigned to a particular potential terminal site of opposite polarity as the first terminal site, designating the particular potential terminal site as the current opposite-polarity potential terminal site.

3. The method of claim 2, wherein the potential terminal sites are ordered such that potential terminal sites close to the source node occur earlier in the site order than potential terminal sites more distant from the source node, and the terminals are ordered in increasing order of required arrival times of the source signal at each of the terminals.

4. The method of claim 3, wherein attempting to find a partial buffering solution with said next succeeding terminal assigned to the current potential terminal site comprises sizing buffers on signal paths between assigned terminals and the source signal so as to satisfy, if possible, required arrival times of the source signal at said assigned terminals.

5. The method of claim 4, in step e) of which, if said failure criterion is satisfied, producing an indication that the required arrival times cannot be satisfied.

6. The method of claim 5, comprising the further steps of:
adding an incremental value to the required arrival times; and
repeating steps d), e) and f).

7. The method of claim 5, wherein said failure criterion is satisfied when the first terminal has been unassigned in step j).

8. An automated method of designing a buffer circuit for fanning out a source signal to a plurality of terminals of specified polarities in accordance with specified time constraints, comprising the steps of:

specifying a circuit template as a tree structure having a root representing a source node receiving said source signal and having nodes each forming the site of a generalized inverting or non-inverting buffer, a plurality of said nodes being designated as potential terminal sites of positive and negative polarities, respectively;

ordering the terminals in increasing order of required arrival times of the source signal at each of the terminals;

repeatedly producing buffer circuit designs for initial sublists of said order by the following steps:

a) finding the largest initial sublist of said order for which an assignment has previously been produced by step c), and for which a sizing of buffers meeting the time constraints has previously been produced by step d), and which has not been labelled unusable by step f), where by convention if no such initial sublist exists said initial sublist is taken to be the empty list;

b) forming an augmented sublist by adding to said initial sublist the next terminal in said order;

c) forming a new assignment for said augmented sublist by assigning each terminal of said initial sublist to the site to which it was assigned in said previously produced assignment and assigning said next terminal to a tree site according to a predetermined initial-assignment rule;

d) sizing buffers for said new assignment;

e) if said sizing of buffers fails to meet the time constraints, repeating step c) and step d), at each repetition assigning said next terminal to a different site according to a predetermined next-assignment rule;

f) if said next-assignment rule indicates that there are no more sites to be tried, labelling the initial sublist as unusable and, if the initial sublist is the empty list, terminating without having produced a desired buffer circuit design; and g) if said sizing of buffers meets said time constraints and said augmented sublist includes all terminals, terminating having successfully produced the desired buffer circuit design.

9. The method of claim 8, comprising the further step of specifying an integer level for each potential terminal site, and wherein said initial-assignment rule consists of assigning said next terminal to the same site to which the last terminal of the same polarity as said next terminal in said initial sublist was assigned in said previous produced assignment if such last terminal exists, else assigning it to a site of lowest level in the ordering of sites of the same polarity as said next terminal.

10. The method of claim 9, wherein said next-assignment rule consists of assigning said next terminal to a lowest level site among all sites having the same polarity as said next terminal and having a level greater than or equal to the level of the site to which said next terminal is currently assigned and to which said next terminal has not previously been assigned in conjunction with said initial sublist and said previously produced assignment if such a lowest level site exists, else indicating that there is no next site to be tried.

11. The method of claim 8, wherein said next-assignment rule indicates there is no next site to be tried after said next terminal has been reassigned a predetermined number of times.

12. The method of claim 8, wherein the step of sizing buffers consists of choosing for each site that is used in said new assignment a generalized buffer that is a configuration of inverter and buffer cells functionally equivalent to a buffer or inverter.

13. The method of claim 12, wherein said generalized buffer is chosen from a pre-computed list of generalized buffers.

14. The method of claim 1, 2, 3, 4, or 5, comprising the further step of defining sets of generalized inverting and non-inverting buffer circuits, all buffer circuits within each set having one of an increasing sequence of input capacitance values, buffer circuits within any given set having a range of drive capabilities, wherein said sizing step comprises the steps of:

for each currently utilized buffer site, defined as a buffer site on a signal path between a currently assigned terminal and the source signal, specifying an initial physically-smallest buffer circuit having a least input capacitance value;

using a specified actual arrival time at the source signal, calculating actual arrival times of the source signal at outputs of all specified buffer circuits;

using the required arrival times at said terminals, calculating required arrival times of said source signal and said source node and at said outputs of all specified buffer circuits;

calculating slack at said source node and said outputs where slack is the required arrival time minus the actual arrival time at a given circuit node;

identifying as critical any buffer site at which slack at the corresponding buffer output is equal to slack at the source node;

for each critical buffer site, selecting from the set of buffer circuits having a least input capacitance value a replacement buffer circuit that has greater drive capability than the physically-smallest buffer circuit and that maximizes slack at the buffer circuit output;

for each critical buffer site, calculating slack improvement using performance parameters of said buffer circuit that has greater drive capability; and if slack improvement at least one of said critical buffer sites is positive, determining at which critical buffer site slack improvement is greatest and specifying for that site said replacement buffer circuit instead of said initial buffer circuit.

15. The method of claim 14 wherein said sizing step further comprises the steps of:

recalculating slack at said source node; and if said required arrival times are not satisfied, repeating the steps of claim 22 but selecting for each critical buffer site a buffer circuit having a next greater input capacitance value than a buffer circuit currently specified for said critical buffer site.

* * * * *